United States Patent
Belitzer (10) Patent No.: US 9,106,402 B2
(45) Date of Patent: *Aug. 11, 2015

(54) SIGNAL DELAY ESTIMATOR WITH ABSOLUTE DELAY AMOUNT AND DIRECTION ESTIMATION

(71) Applicant: Intel Mobile Communications GmbH, Neubiberg (DE)

(72) Inventor: Alexander Belitzer, Munich (DE)

(73) Assignee: Intel Deutschland GmbH, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 14/312,024

(22) Filed: Jun. 23, 2014

(65) Prior Publication Data

US 2014/0301514 A1    Oct. 9, 2014

Related U.S. Application Data

(63) Continuation of application No. 13/727,908, filed on Dec. 27, 2012, now Pat. No. 8,781,049.

(51) Int. Cl.
*H04L 7/00* (2006.01)
*H04L 7/033* (2006.01)
*H03L 7/08* (2006.01)

(52) U.S. Cl.
CPC ............... *H04L 7/0337* (2013.01); *H03L 7/08* (2013.01); *H04L 7/0033* (2013.01); *H04L 7/0079* (2013.01)

(58) Field of Classification Search
CPC .. H04B 17/00; H04B 17/0002; H04B 17/003; H04B 17/0037; H04B 17/009; H03L 7/00
See application file for complete search history.

(56) References Cited

U.S. PATENT DOCUMENTS

| 4,373,191 A | 2/1983 | Fette et al. |
| 6,947,551 B2 | 9/2005 | Givens |
| 7,492,812 B2 | 2/2009 | Ninomiya et al. |

(Continued)

FOREIGN PATENT DOCUMENTS

WO    2004053835 A1    6/2004

OTHER PUBLICATIONS

G. Jacovitti and G. Scarano, "Discret Time Techniques for Time Delay Estimation," IEEE Transactions on Signal Processing, vol. 41, No. 2, Feb. 1993. 9 Pages.

(Continued)

*Primary Examiner* — Siu Lee
(74) *Attorney, Agent, or Firm* — Eschweiler & Associates, LLC (57) ABSTRACT

A signal delay estimator includes an adjustable delay element for delaying a first signal to obtain a delayed first signal, a delay amount estimator for estimating a delay amount between the delayed first signal and a second signal that is similar and delayed relative to the first signal, and a leading signal determiner for determining whether the delayed first signal leads the second signal or vice versa, and for generating a corresponding binary signal. A selective inverter is provided for selectively inverting the delay amount depending on the binary signal. The signal delay estimator also includes a feedback element to the adjustable delay element for controlling a delay based on an output of the selective inverter. Another exemplary signal delay estimator includes a closed control loop with an adjustable delay element and separate first and second processing paths for absolute delay amount and delay direction, respectively.

22 Claims, 11 Drawing Sheets

(56) References Cited

U.S. PATENT DOCUMENTS

| | | |
|---|---|---|
| 7,764,935 B2 * | 7/2010 | Pallonen et al. ............ 455/115.1 |
| 8,638,836 B2 | 1/2014 | Midya et al. |
| 8,781,049 B1 * | 7/2014 | Belitzer ........................ 375/354 |
| 2004/0114556 A1 | 6/2004 | Miller et al. |
| 2006/0067427 A1 * | 3/2006 | Zolfaghari et al. ............ 375/297 |
| 2011/0187433 A1 * | 8/2011 | Baumann et al. .............. 327/276 |
| 2011/0260790 A1 * | 10/2011 | Haddad .......................... 330/107 |
| 2011/0298505 A1 * | 12/2011 | Khoury et al. ................ 327/156 |
| 2012/0287980 A1 | 11/2012 | Epifano |

OTHER PUBLICATIONS

Notice of Allowance dated Mar. 13, 2014 for U.S. Appl. No. 13/727,908.

* cited by examiner

SIGNAL DELAY ESTIMATOR WITH ABSOLUTE DELAY AMOUNT AND DIRECTION ESTIMATION

REFERENCE TO RELATED APPLICATION

This application is a continuation of U.S. application Ser. No. 13/727,908 filed on Dec. 27, 2012.

FIELD

The disclosure relates to a signal delay estimator. Furthermore, the disclosure relates to a method for estimating a delay between a first signal and a similar second signal. Furthermore, the disclosure may relate to a mobile communication device. Furthermore, the disclosure may relate to a signal delay tracking loop.

BACKGROUND

In many signal processing applications there is often a need to estimate an amount of delay introduced by circuitry. Taking modern wireless transmitters as one of many possible examples (e.g., wireless transmitters in mobile phones, or in computers with built-in transceivers), knowledge of the transmitter's delay (i.e., between input and output) may be an integral part of techniques applied to make any of a number of types of measurements in a closed-loop configuration. Different types of measurements can be made with such a configuration, such as (without limitation): transmitter power measurement, transmitter gain measurement, transmitter phase measurement, transmitter IQ mismatches (i.e., mismatches between amplitude and/or phase of an In-phase and Quadrature signal pair), and transmitter adaptive pre-distortion.

In a closed-loop configuration, the feed-back signal typically is a delayed but accurate (or at least highly similar) copy of the base-band transmitted signal. This delay will vary with process, transmitter settings, temperature, and the like. The loop-back delay can severely degrade the closed-loop measurement if not compensated for.

SUMMARY

Embodiments of the disclosure provide a signal delay estimator comprising an adjustable delay element, a delay amount estimator, a leading signal determiner, a selective inverter, and a feedback element. The adjustable delay element is configured to delay a first signal to obtain a delayed first signal. The delay amount estimator is configured to estimate a delay amount between the delayed first signal and a second signal. The second signal is similar to the first signal and delayed relative to the first signal. The leading signal determiner is configured to determine whether the delayed first signal leads the second signal or vice versa, and generate a corresponding binary signal. The selective inverter is configured to selectively invert the delay amount depending on the binary signal. The feedback element to the adjustable delay element is configured to control a delay based on an output of the selective inverter.

According to further embodiments, a signal delay estimator comprises a closed control loop. The closed control loop comprises an adjustable delay element as a control element and separate first and second processing paths for an absolute delay amount and a delay direction, respectively. The delay direction indicates whether a delayed version of a first signal leads a second signal, or vice versa. The second signal is similar and delayed relative to the first signal. The second processing path for the delay direction comprises a slope-selective error signal integrator configured to integrate an error signal between the delayed first signal and the second signal if a slope of the second signal is positive. Furthermore, the second processing path, i.e. the processing path for the delay direction, comprises an integration result evaluator configured to evaluate whether an integration result provided by the slope-selective error signal integrator is greater than a threshold value and set a binary signal to a first value or a second value depending on a result of the evaluation.

Furthermore, the disclosure relates to a mobile communication device comprising an antenna port, an RF-frontend, and a digital baseband processor. The mobile communication device also comprises a signal delay estimator as described above. The RF-frontend of the mobile communication device is coupled to the antenna port and the digital baseband processor of the mobile communication device.

Further embodiments provide a method for estimating a delay between a first signal and a similar second signal. The method comprises delaying the first signal by an adjustable delay to obtain a delayed first signal and estimating a delay amount between the delayed first signal and the second signal. The method also comprises determining whether the delayed first signal leads the second signal or vice versa and generating a corresponding binary signal based thereon. The delay amount is selectively inverted depending on the binary signal to obtain a conditionally inverted delay amount. The adjustable delay used for delaying the first signal is adjusted based on the conditionally inverted delay amount.

According to further embodiments, a method for estimating a delay between a first signal and a second signal comprises delaying the first signal by an adjustable delay to obtain a delayed first signal and determining an error signal between the delayed first signal and the second signal. The error signal is integrated if a slope of one of the first signal and the second signal is positive. The method further comprises evaluating whether an integration result is greater than a threshold value, and setting a binary signal to a first value or a second value depending on a result of the evaluation.

BRIEF DESCRIPTION OF THE DRAWINGS

The disclosure will be described in the following using the accompanying figures in which.

DETAILED DESCRIPTION

Different embodiments of the teachings disclosed herein will subsequently be discussed referring to the Figures. Below, identical or similar reference numerals are provided to objects having identical or similar functions so that objects referred to by identical reference numerals within the different embodiments are interchangeable and a description thereof is mutually applicable.

Figure 1:
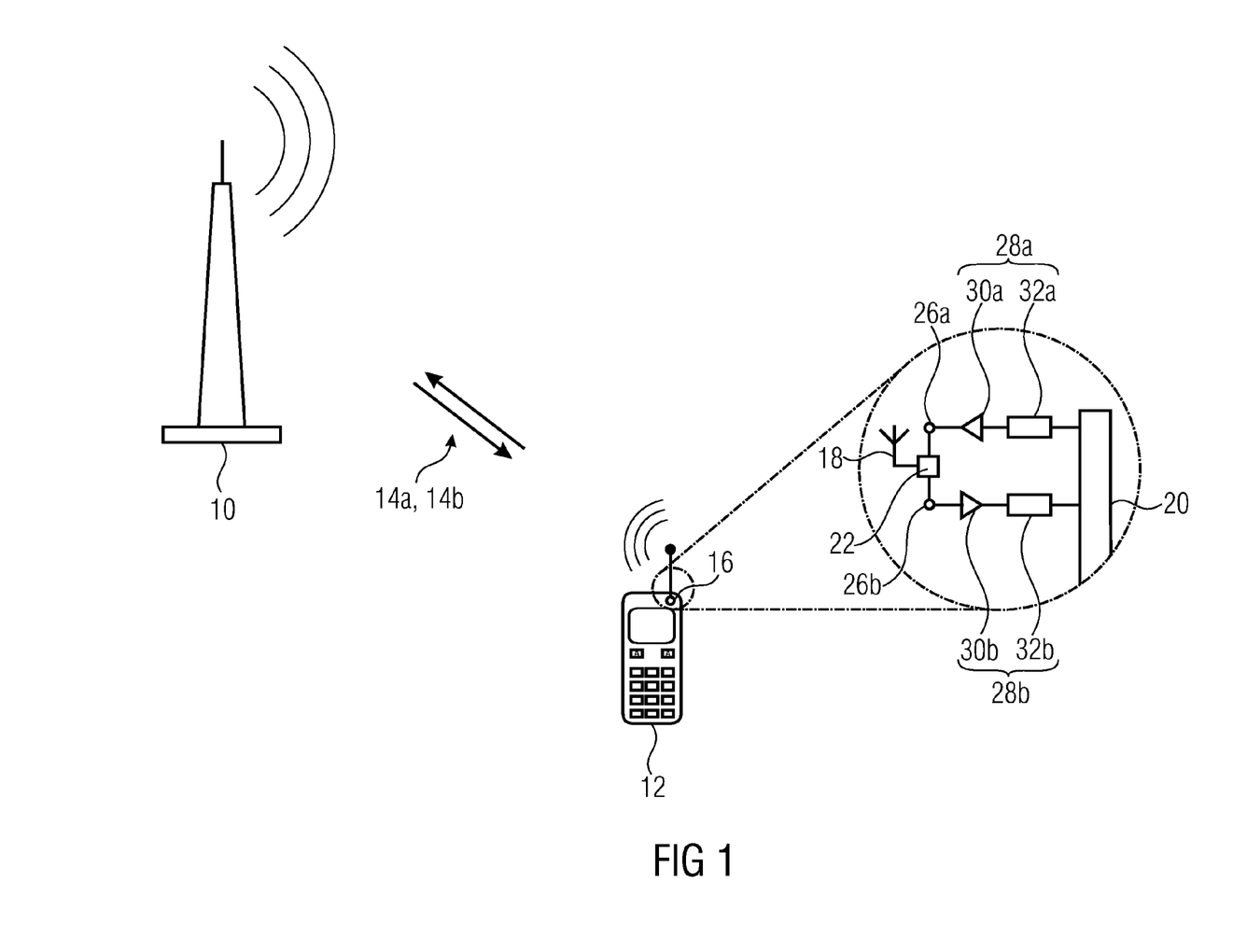
FIG. 1 shows a schematic block diagram of a communication system and a mobile communication device having a transceiver with an improved push-pull amplifier.

FIG. 1 shows, in schematic manner, a base station 10 and a mobile communication device 12 which are connected via a downlink port 14a and an uplink port 14b of an air interface. The mobile communication device 12 comprises a transceiver 16, an enlarged view of which is schematically shown.

The transceiver 16 is connected to an antenna 18 and comprises an analog frontend and a baseband processor 20. The analog frontend comprises a signal divider element 22 (e.g. a circulator or duplexer), a transmitter 28a, and a receiver 28b. The transmitter 28a and the receiver 28b are arranged between the signal divider element 22 and the baseband processor 20. The transmitter 28a is connected to the divider element 22 via a differential interface 26a. The transmitter 28a comprises a differential amplifier 30a and a mixer arrangement 32a which is arranged between the amplifier 30a and the baseband processor 20. The amplifier 30a of the transmitter 28a amplifies a signal provided by the mixer arrangement 32a and feeds it via the differential interface 26a to the divider element 22. The receiver 28b is connected to the divider element 22 via another differential interface 26b. The receiver 28b comprises a differential amplifier 30b and a mixer arrangement 32b which is arranged between the amplifier 30b and the baseband processor 20. The amplifier 30b of the receiver 28b may be a low noise amplifier (LNA) and is configured to amplify a signal received by the antenna 18 and forwarded to an input of the amplifier 30b via the signal divider element 22 and the differential interface 26b. The amplified signal output by the amplifier 30b is fed to the mixer arrangement 32b for frequency down mixing and subsequent processing by the baseband processor 20.

The transmitter 28a typically distorts or otherwise modifies the signal provided by the baseband processor 20. The distortion and/or other modification introduced by the transmitter 28a typically varies with the operating and environmental conditions. In order to be able to maintain the signal properties of the signal radiated via the antenna within a desired range, it may be necessary to adjust one or more operating parameters of the transmitter 28a, such as a supply voltage or a bias condition of the amplifier 30a. This in turn may require a comparison of the signal output by the transmitter 28a and the signal output by the baseband processor 20 so that an amount of the distortion and/or modification introduced by the transmitter 28a can be assessed. As the transmitter 28a, in addition, typically also introduces a varying delay, the delay needs to be known or estimated for a meaningful comparison of the two signals. This is where a signal delay estimator may be used. Nevertheless, the signal delay estimator may also be used in other applications, such as audio signal processing, echo suppression, radar applications, sonar application, etc.

Figure 2:
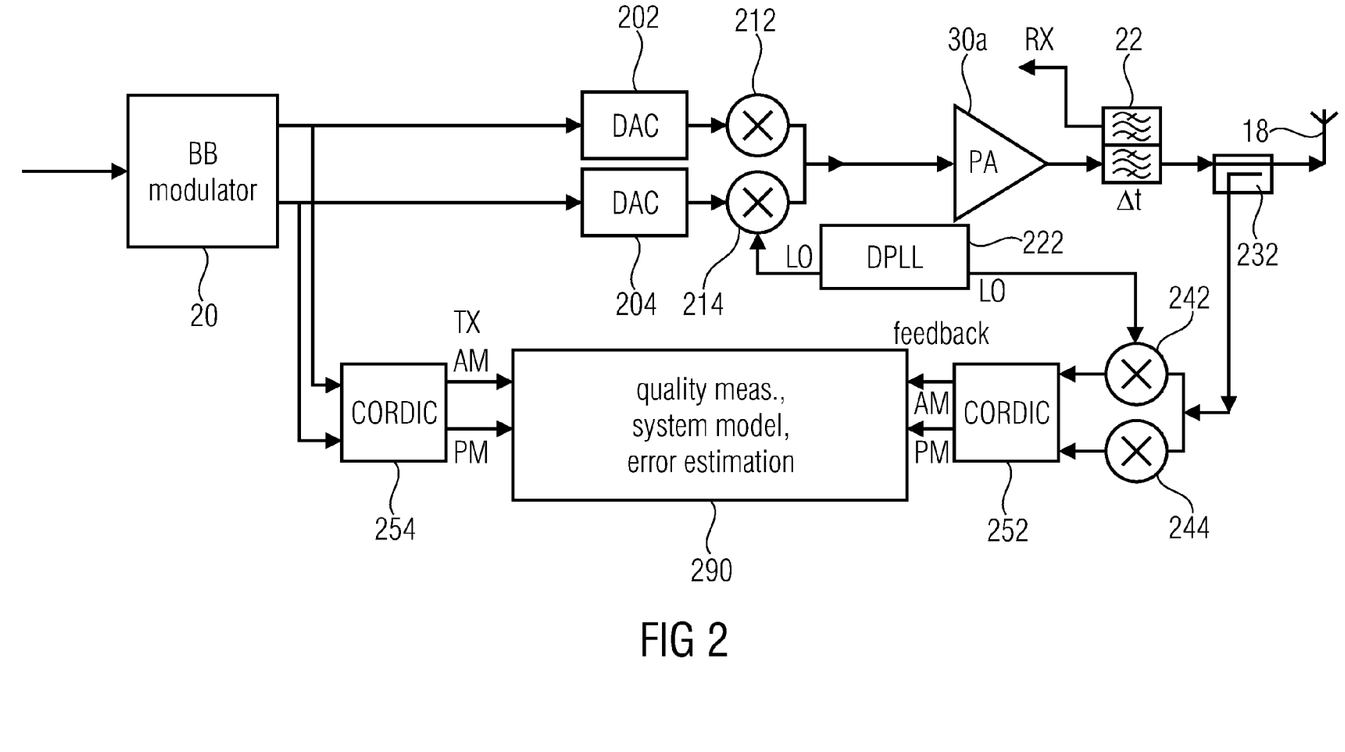
FIG. 2 shows a schematic block diagram a transmitter of a wireless communication device as a system overview.

FIG. 2 shows a schematic block diagram of a transmitter. The transmitter may be part of a transceiver. The receiver portion is not shown in FIG. 2, but it is only indicated where the receiver portion would be connected by the abbreviation RX. In a system as shown in FIG. 2 the forward transmitted signal output by the baseband modulator or baseband processor 20 is to be compared with a feedback signal that is tapped between the duplexer 22 and the antenna 18. The comparison can be done for a measurement of quality of the transmit system, building a transmitter system model (channel model) and/or error estimation, etc. with the target to improve the linearity/efficiency/quality of the system.

In all these applications, often there is a need to align the signals in time (TX versus feedback) before a meaningful model/measurement can be performed.

The transmit signal experiences a delay which is dependent on the operating conditions and is prone to the tolerances of the individual components. In our example the delay ($\Delta t$) is introduced mainly by the duplexer 22.

A simple way is to measure the delay in the Lab or during production using measurement equipment and use the measured delay for the operation. This does not help when the delay is changing with operating conditions (temperature, supply, device ageing).

Another solution is to generate a test signal (with a predefined pattern) which allows one to measure (and adjust) the delay. The problem with this approach is that it requires the normal operation (transmission) to pause while the test signal is applied for the delay measurement. This is not allowed for most of the systems (transmission power with test signal would disturb the communication network).

The transmitter schematically illustrated in FIG. 2 further comprises two digital-to-analog converters (DACs) 202 and 204 for converting the digital in-phase and quadrature components provided at outputs of the baseband processor 20 into corresponding analog signals. These analog in-phase and quadrature signals are then mixed with a local oscillator (LO) signal using two mixers 212 and 214 in order to bring the signals from the baseband to a higher frequency range, in the present case the radio frequency (RF) range. The local oscillator signal is generated by a digital phase-locked loop (DPLL) 222.

The in-phase component and the quadrature component output by the mixers 212 and 214, respectively, are fed to the power amplifier 30a which outputs an amplified signal. The amplified signal is provided to the duplexer 22 which is, in the example of FIG. 2, mainly responsible for the delay $\Delta t$. The delayed amplified signal leaves the duplexer at one of its three ports and reaches the antenna 18. A coupler 232 is interconnected between the duplexer 22 and the antenna so that the transmit antenna provided to the antenna 18 can be tapped and forwarded to a pair of down-mixers 242, 244. The down-mixers 242, 244 also receive the local oscillator signal from the DPLL 222 in order to frequency-shift the tapped transmit signal to the baseband frequency range. The two down-mixers 242, 244 provide an in-phase component and a quadrature component for further processing by an CORDIC element 252 performing a CORDIC (Coordinate Rotation Digital Computer) algorithm. The CORDIC element 252 converts the IQ representation of the tapped and down-mixed transmit signal to a polar representation having an amplitude component AM and a phase component PM. The amplitude component AM and the phase component PM are provided to an evaluation circuit 290 for quality measurement, system model, error estimation and/or other purposes. The evaluation circuit 290 also receives the amplitude component AM and the phase component PM that correspond to the in-phase component and the quadrature component output by the baseband processor 20 after conversion to polar representation by a further CORDIC element 254. As an alternative to the CORDIC elements 252, 254, other vector-to-polar converters may be used.

The delay tracking loop is further described in the context of two different systems as application examples: IQ-transmitter/receiver for LTE standard (FIG. 3), and Polar-transmitter/receiver for GSM, EDGE, UMTS standards (FIG. 4).

For both systems, the target is to measure the delay between the feedback signal (inp2) and the forward signal (inp1). The delay measurement can be done during active transmission and does not require a special modulation pattern.

Figure 3:
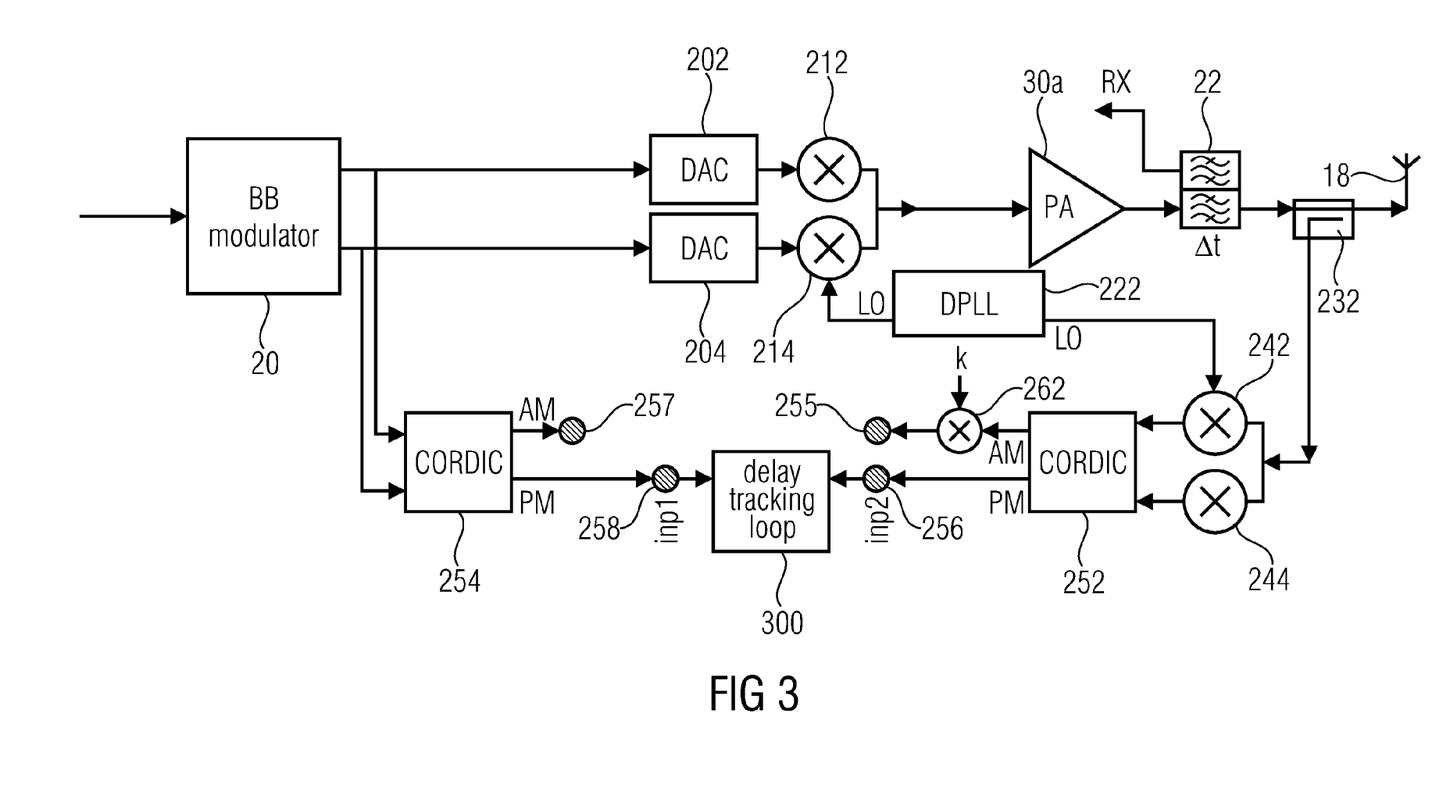
FIG. 3 shows a schematic block diagram of an IQ transmitter/receiver system with delay tracking loop.

FIG. 3 shows a schematic block diagram of an IQ (in-phase/quadrature) transmitter/receiver system with delay tracking loop. The transmitter/receiver system in FIG. 3 is similar to the transmitter/receiver system shown in FIG. 2 with the exception that the evaluation circuit 290 is not depicted in FIG. 3, but instead a signal delay estimator 300 is depicted. The signal delay estimator 300 may be a delay tracking loop. Note the evaluation circuit 290, although not explicitly illustrated in FIG. 3, may nevertheless be present and, for example, connected to at least one of the terminals 255, 256, 257, and 258. The IQ transmitter/receiver system shown in FIG. 3 further comprises a scaling element 262 for scaling the amplitude component AM output by the CORDIC element 252 by a gain k.

Figure 4:
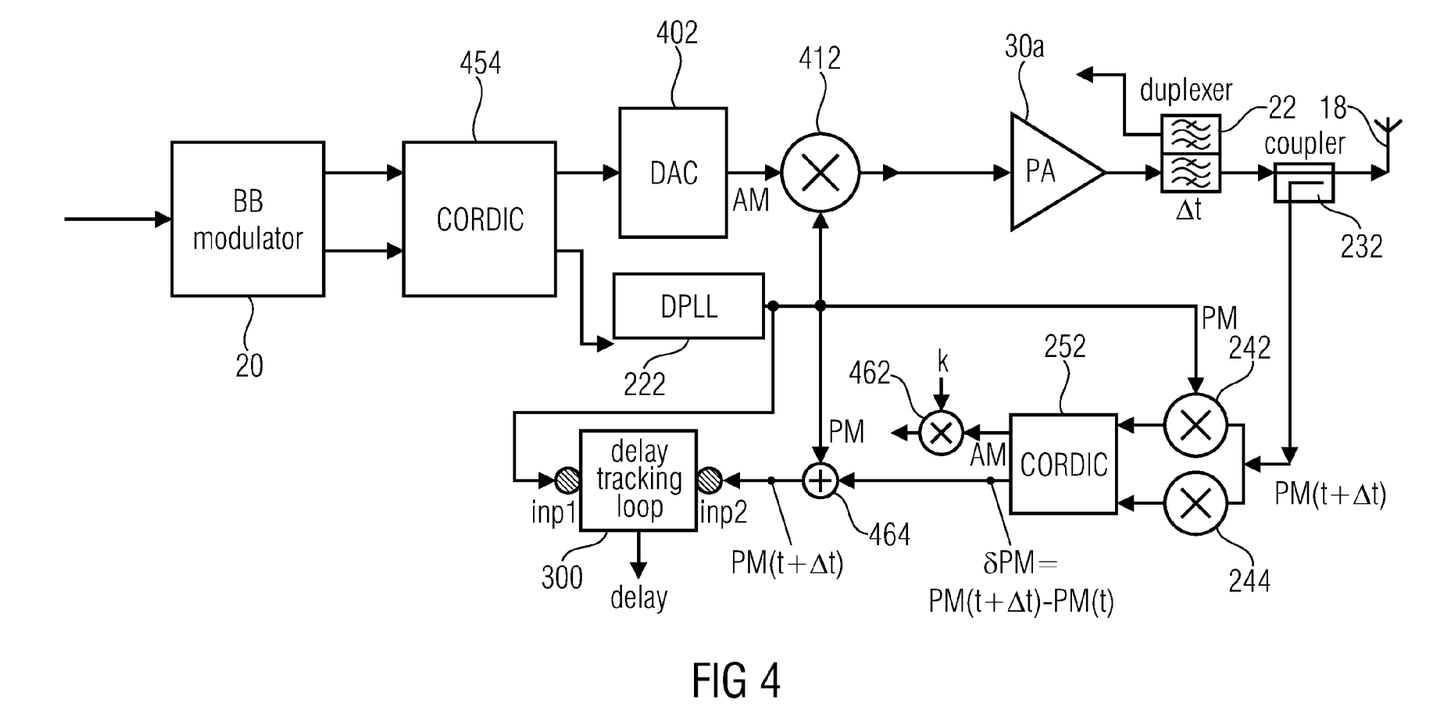
FIG. 4 shows a schematic block diagram of polar transmitter/receiver system with delay tracking loop.

FIG. 4 shows a schematic block diagram of a polar transmitter/receiver system with the delay tracking loop 300. The transmit chain comprises a transmit CORDIC element 454 for converting the signals output by the baseband processor 20 from vector representation to polar representation. The amplitude component is provided to digital-to-analog converter 402. The phase component is provided to the DPLL 222. The analog amplitude component AM is then frequency-shifted by a mixer 412 which receives a local oscillator signal from the DPLL 222. The local oscillator signal contains the phase information of the signal to be transmitted since the DPLL 222 is controlled by the phase component provided by the transmit CORDIC element 454. The up-mixed amplitude component is fed to the power amplifier 30a and from here the signal processing up to the antenna 18 is substantially identical to the IQ case depicted in FIG. 3.

The polar transmitter/receiver system in FIG. 4 further comprises the feedback arrangement with the pair of down-mixers 242, 244, the CORDIC element 242, and the scaling element 262 for the amplitude component, as described above in connection with FIG. 3. In addition, the feedback arrangement in FIG. 4 comprises a summing element 464 configured to sum the output of the DPLL 222 and the phase component from the CORDIC element 252, i.e.: $PM(t+\Delta t)=PM(t)+\delta PM=PM(t)+PM(t+\Delta t)-PM(t)$.

The measured delay can be used to align the signals in time. As shown in FIGS. 3 and 4, the delay measurement can be done either on the phase signal (PM) or on the amplitude signal (AM). For the AM alignment the gain k has to be well known (or measured prior to activation of the delay estimation loop. For example, hardware solutions may be used to measure the factor k), whereas the PM alignment works for signals with different amplitude (gain mismatch can be ignored). Once the signals are adjusted in time, cancelation of phase modulation of the feedback signal can be performed to enable learning algorithm for AM/AM, AM/PM distortion of the whole transmitter OR measurement of error vector magnitude OR any other application relying on well time-aligned signals.

Figure 5:
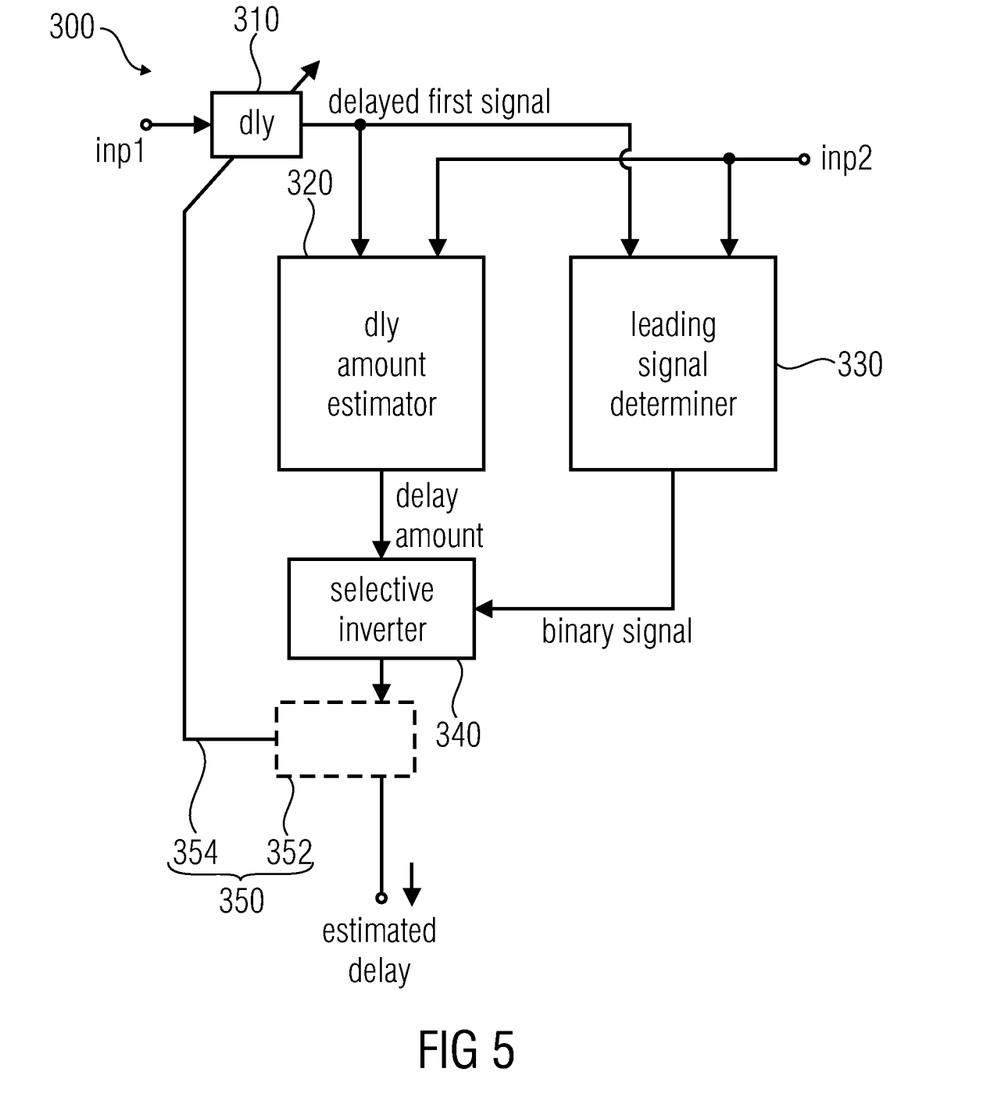
FIG. 5 shows a schematic block diagram of a signal delay estimator.

FIG. 5 shows a schematic block diagram of an example signal delay estimator (delay tracking loop) 300. The signal delay estimator 300 comprises an adjustable delay element 310 for delaying a first signal inp1 to obtain a delayed first signal inp1(t+$\Delta$t). A delay amount estimator 320 is connected to an output of the adjustable delay element 310 and configured to estimate a delay amount $\Delta$t between the delayed first signal and a second signal inp2 that is similar and delayed relative to the first signal inp1.

The signal delay estimator 300 also comprises a leading signal determiner 330 for determining whether the delayed first signal inp1(t+$\Delta$t) leads the second signal inp2 or vice versa, and for generating a corresponding binary signal. A selective inverter 340 is provided for selectively inverting the delay amount depending on the binary signal. The signal delay estimator further comprises a feedback element 350 to the adjustable delay element 310 for controlling a delay or a variable delay portion based on an output of the selective inverter 340. In the example depicted in FIG. 5 the delay element 350 comprises an optional fixed delay portion adder 352 and a feedback line 354. The variable delay portion may be positive or negative, depending on the output of the leading signal determiner 330 and of the selective inverter 340.

Figure 6:
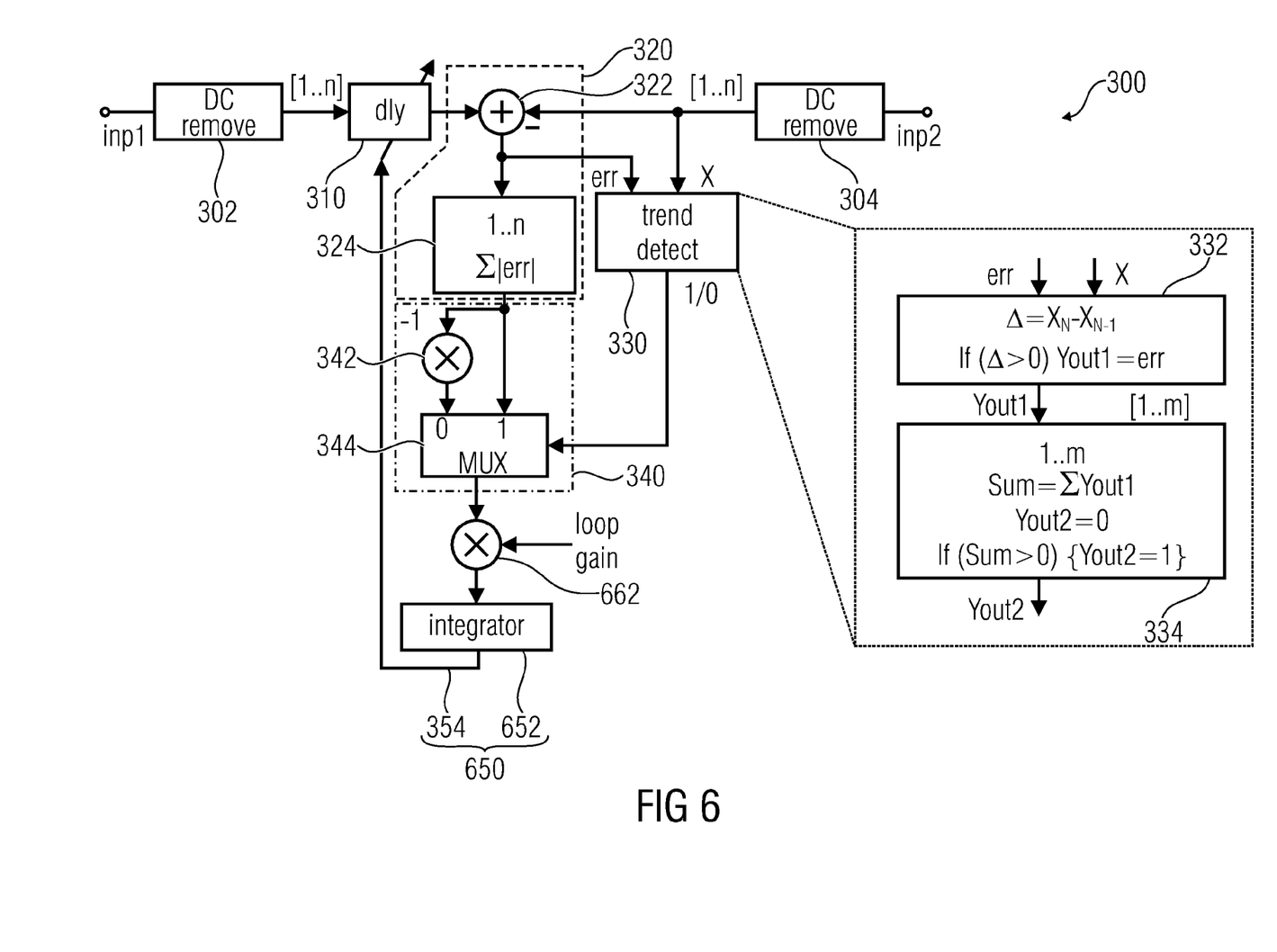
FIG. 6 shows a schematic block diagram of a signal delay estimator with a different configuration.

FIG. 6 shows a schematic block diagram of another example signal delay estimator (delay tracking loop) 300.

DC (Direct Current) components are removed from signals inp1 and inp2 using a first DC remover 302 and a second DC remover 304. For example, this can be done by differentiating the input signal X(n) (inp1 or inp2) to provide the output signal Y=X(n)−X(n−1), or applying a more dedicated high pass filter.

The DC-removed first signal inp1 is delayed by an integer and fractional portion of the sampling rate, using a buffer for integer delay and an allpass IIR filter for fractional delay that together form the adjustable delay element 310 in one embodiment. The fractional delay can also be achieved by a FIR filter (Lagrange structure) or any other filter structure commonly used for fractional delay implementation.

The delay amount estimator 320 comprises a subtraction element 322 and a discrete absolute amount integrator 324. An error signal err is computed, wherein err=inp1−inp2 by the subtraction element 322.

The delay amount is proportional to the sum(abs(err)) for a sequence of samples, indicated by [1 . . . n] in FIG. 6. The delay amount is determined by the discrete integrator 324.

The delay direction (increase/decrease decision) is calculated by the "trend detect" block which is similar or corresponds to the leading signal determiner 330. The leading signal determiner 330 comprises slope detector 332 and an error integrator 334. The idea is to sum up the error signal err only when a positive slope of the signal X (i.e., the DC-removed second signal inp2) is detected. To this end, the derivative or slope $\Delta$ of the second signal inp2 is determined by subtracting the previous sample of the second signal inp2$_{N-1}$ from the current sample inp2$_N$ (in FIG. 6, the second signal inp2 is designated as X, as it is an input signal of the processing block 332). If the slope $\Delta$ is positive (or in general: greater than a threshold), then the slope detector 332 outputs the value of the error signal err. If the slope $\Delta$ is negative (or less than said threshold), the output of the slope detector 332 is zero. The output of the slope detector 332 is designated as Yout1 in FIG. 6.

The error integrator 334 is configured to integrate, or sum up, the output Yout1 of the slope detector 332 over a certain time period, for example m samples (samples [1 . . . m]). Now, if this sum(Yout1) is positive, then the delayed first signal inp1(t+$\Delta$t) signal was faster in time than the second signal inp2 and, therefore, the delay of the first signal inp1 has to be increased. If the sum of the error signal sum(err) is negative, then we have to decrease the delay of the first signal inp1. This is indicated by the binary signal Yout2 which is zero unless the sum is greater than zero. It is also possible to use another threshold value than 0.

The signal delay estimator 300 in FIG. 6 further comprises the selective inverter 340 which itself comprises an inverting element 342 (e.g., a multiplication with −1) and a multiplexer 344. The multiplexer 344 is controlled by the binary signal Yout2 and comprises two input ports for the delay amount scaled with the 1 and −1, respectively (depending on the detected delay direction).

The selectively inverted gain amount output by the selective inverter 340 is now scaled with appropriate gain using a scaling element 662 and integrated within an integrator 652. The integrator may be regarded as a part of the feedback element 650, but this is not necessarily so. The gain can be dynamically set/adjusted versus time. First, starting with high gain for faster locking of the delay tracking loop, then reducing the gain as the time proceeds, allowing for slower but more accurate settling of the delay. In case of a noisy signal the lower gain helps to reduce the effect of the noise and improve the accuracy of the delay measurement (but also extends the measurement time).

The output of the integrator 652 is fed back via the feedback line 354 into the delay block 310 for adjusting the signal inp1 in time until it matches to the signal inp2. Note: the delay block 310 can also be applied on the second signal inp2 instead of the first signal inp1 (as another implementation example). In this case the trend detection has to invert its sign.

Figure 7:
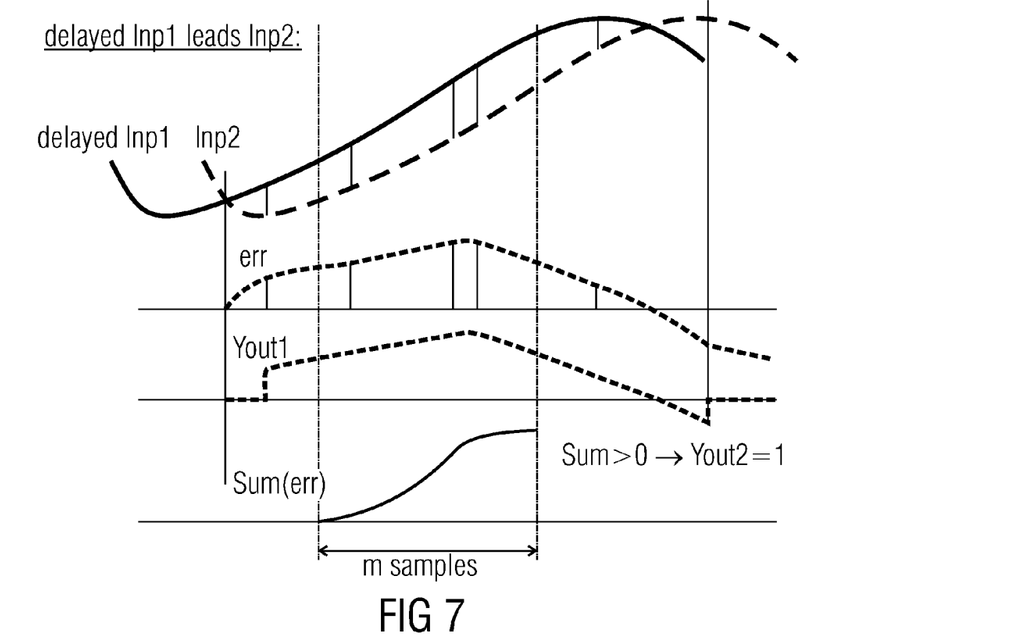
FIG. 7 schematically shows a waveform of various signals processed by an example signal delay estimator when a delayed first signal leads a second signal.
Figure 8:
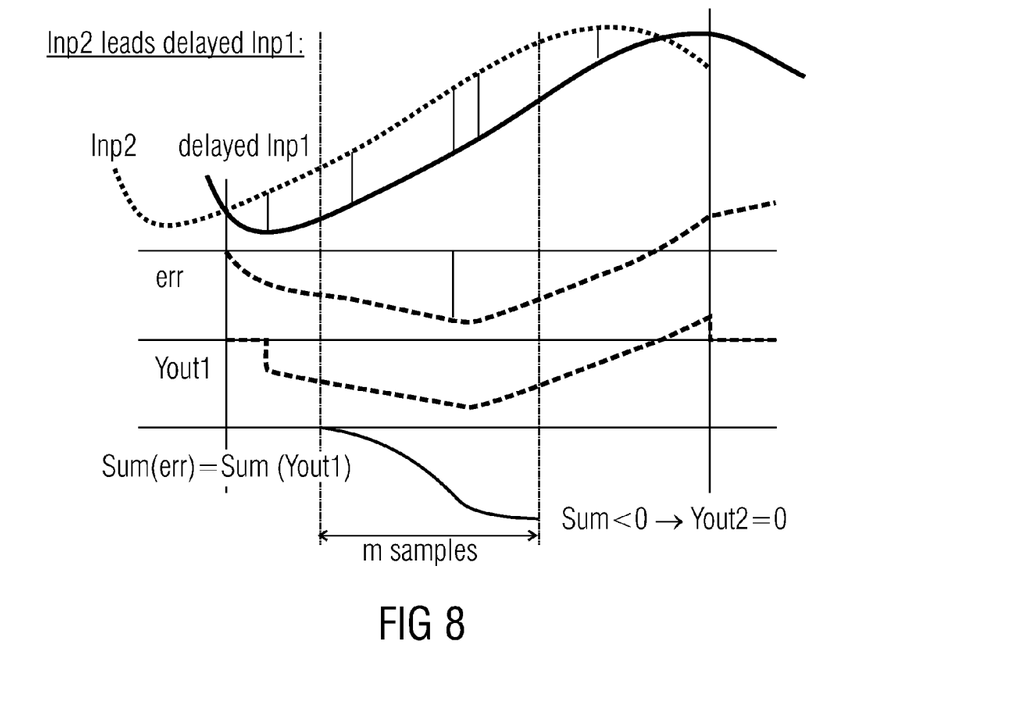
FIG. 8 schematically shows a waveform of various signals processed by an example signal delay estimator when the second signal leads the first signal.

FIGS. 7 and 8 illustrate waveforms of different signals within the signal delay estimator. In FIG. 7 the delayed first signal inp1(t+Δt) leads the second input signal inp2. In FIG. 8, the second signal inp2 leads the delayed first signal inp1 (t+66 t). FIG. 7 illustrates that the output Yout1 of the slope detector 332 is zero at first, because the second signal inp2 has a negative slope. When the second signal inp2 starts to have a positive slope the signal Yout1 passes begins to be equal to the error signal err. The signal Yout1 is integrated as Sum(err) =Sum(Yout1). At the end of the slope evaluation interval of m samples the sum is evaluated against a threshold, for example against zero. In FIG. 7 the sum is greater than zero so that the binary signal Yout2 is set to 1. In FIG. 8, the error signal err and consequently also the signal Yout1 is negative during majority of the interval of m samples (actually during the entire interval of m samples) so that at the end of the interval the sum is negative, as well. Accordingly, the binary signal Yout2 is set to zero.

The delay direction determination typically functions in a reliable manner up to a delay of approximately +/−Π/4, or +/−90 degrees. However, if the first and second signals inp1 and inp2 differ too much from each other (are not sufficiently similar), the operating range of the delay tracking loop may be smaller.

Figure 9:
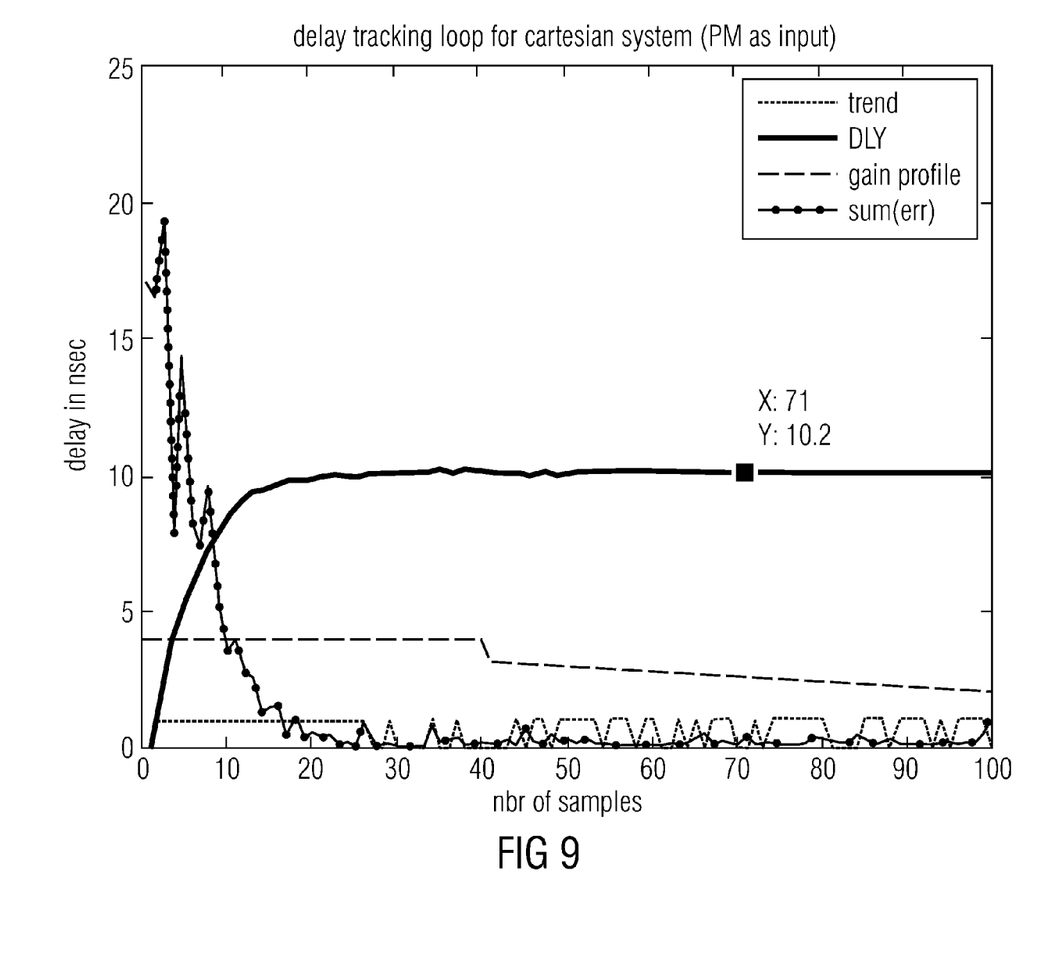
FIG. 9 shows a simulation example of various signals for a Cartesian system with PM as an input.

FIG. 9 shows the simulated behavior of the delay tracking loop used within a Cartesian system. The phase information PM output from the two CORDIC elements 252 and 254 are used as input for the delay tracking loop. The system delay of 10.2 nsec was precisely measured for a LTE20 signal on IQ transmitter/receiver system as indicated in the FIG. 3. The plot with the large dots (sum(err)) is showing the detected delay mismatch between the two signals—after the loop settles, it reduces to noise only. The dashed curve (gain profile) is showing how the gain was set high for faster locking and then reduced down to eliminate noise effects. The curve with the small dots shows the output of the trend detection. Finally, the thick curve (DLY) shows the measured delay.

The loop achieves at least one of two things: it delivers the measured delay amount of the system AND it aligns the signals inp1 and inp2 in time, thus, they can be directly used for further processing w/o additional time alignment elements.

Figure 10:
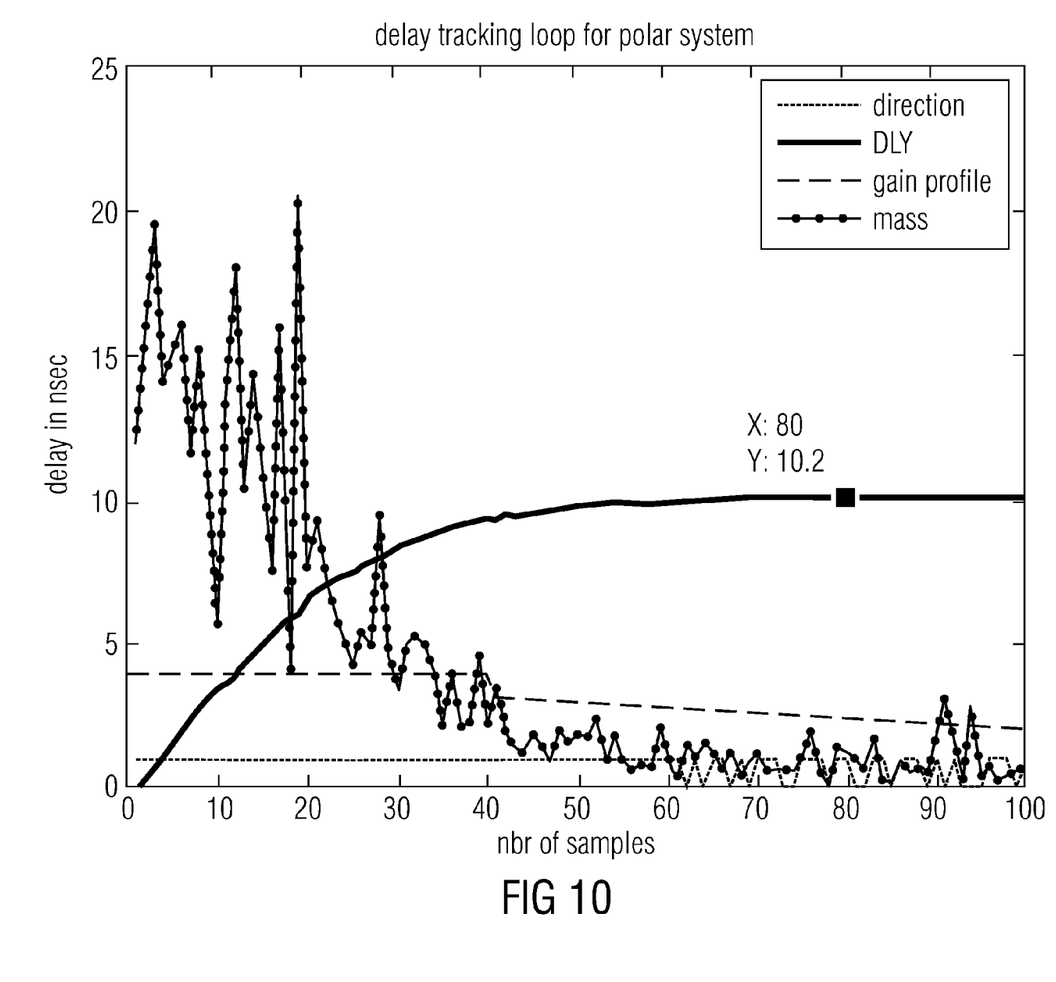
FIG. 10 shows a simulation example of various signals for a polar system.

FIG. 10 below shows the simulated behavior of the loop for a polar transmitter/receiver system as indicated in the FIG. 4 (e.g., for an UMTS (Universal Mobile Telecommunications System) signal with HSUPA (High Speed Uplink Packet Access) data channel scenario). The line with the small dots is the binary signal indicating the direction or "trend" output by the leading signal determiner and trend detector 330. In other words, the binary signal indicates whether the delayed first signal inp1(t+Δt) is leading the second signal inp2, or the other way around. The line with the large dots indicates the sum of the error signal sum(err), or "mass". The dashed line indicates the gain profile which is, as in FIG. 9, relatively high at first, then is nearly stepwise reduced abruptly around sample number 40, and finally slowly fades to a minimum with a negative slope. The thick curve shows the estimated delay and as in FIG. 9 it can be seen that already after approximately 50 samples the correct delay of 10 ns has been reached.

Figure 11:
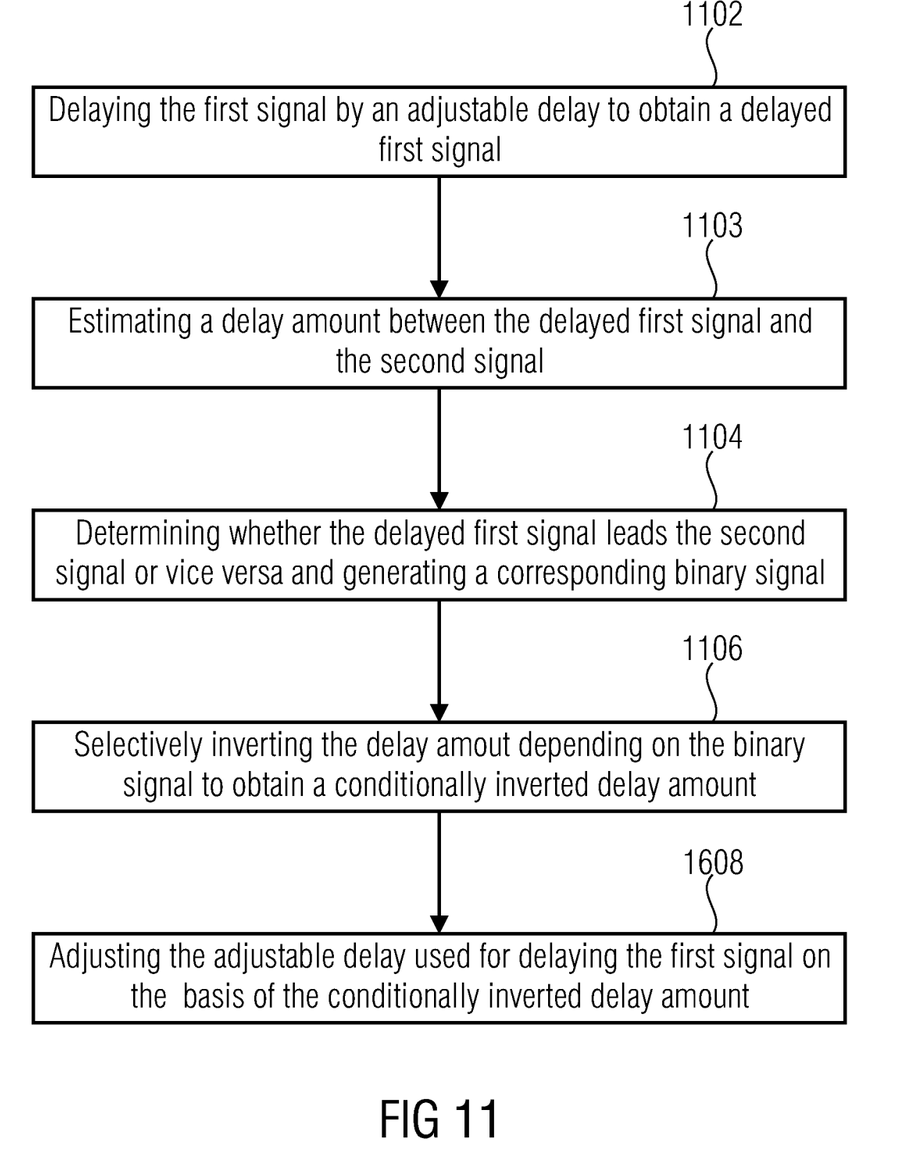
FIG. 11 shows a schematic flow diagram of a method for estimating a signal delay.

FIG. 11 shows a schematic flow diagram of a method for estimating a delay between a first signal inp1 and a similar second signal inp2. The method comprises delaying the first signal inp1 by an adjustable delay Δt to obtain a delayed first signal inp1(t+Δt) at 1102. A delay amount between the delayed first signal inp1(t+Δt) and the second signal inp2 is then estimated at 1103. The method also comprises determining whether the delayed first signal inp1(t+Δt) leads the second signal inp2 or vice versa and generating a corresponding binary signal at 1104. The delay amount is selectively inverted depending on the binary signal to obtain a conditionally inverted delay amount at 1106. The method further comprises adjusting the adjustable delay used for delaying the first signal based on the conditionally inverted delay amount at 1608.

Figure 12:
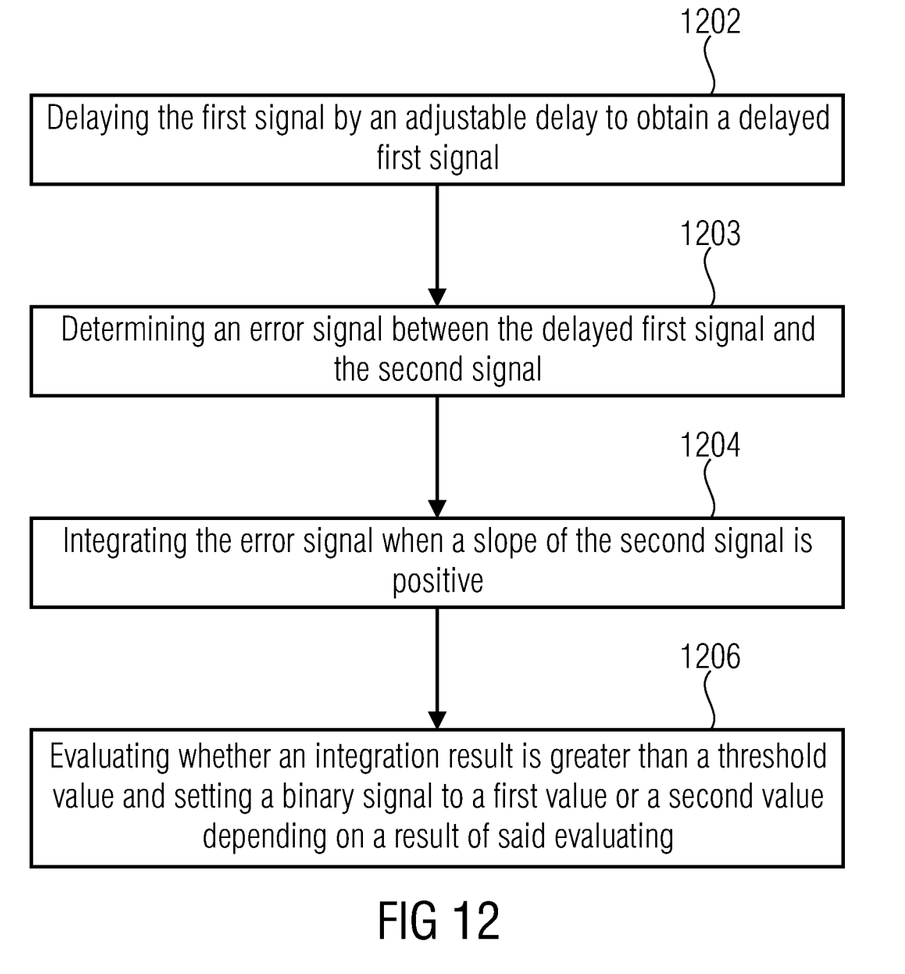
FIG. 12 shows a schematic flow diagram of another method for estimating a signal delay.

FIG. 12 shows a schematic flow diagram of a method for estimating a delay between a first signal and a second signal. The method comprises delaying the first signal inp1 by an adjustable delay Δt to obtain a delayed first signal inp1(t+Δt) at 1202. The method also comprises determining an error signal err between the delayed first signal inp1(t+Δt) and the second signal inp2 at 1203. The error signal err is integrated if a slope of one of the (delayed) first signal inp1(t+Δt) and the second inp2 signal is positive at 1204. During act 1206 of the method it is evaluated whether an integration result is greater than a threshold value and a binary signal is set to a first value or a second value depending on a result of the evaluation.

As an alternative to act 1204 the error signal may be integrated when the slope of the second signal inp2 or the (delayed) first signal inp1(t+Δt) is negative. In this case the act of selectively inverting the delay amount is adapted accordingly.

In contrast to the measurement of the delay in the lab or at the end of manufacturing, the proposed signal delay estimators and corresponding methods are capable of measuring the delay during TX operation and, thus, can cope with the changing conditions.

In contrast to delay measurements using a test signal while pausing the normal operation, the proposed signal delay estimators and corresponding methods are typically capable of using the "normal" TX signal and do not need a special test pattern. It is investigated on GSM, EDGE, TD-SCDMA, UMTS and LTE system (but can work with many other RATs (Radio Access Technologies) as well).

At least one aspect of the invention is a method for an automatic delay measurement, which can measure the delay and align two similar signals in time.

The application of the delay-tracking-loop or signal delay estimator is not limited to the cellular systems shown above, but can be in general applied whenever a delay of two similar signals is of interest.

A number of products, which have the possibility to detect distortion parameters (AMPM distortion) may require a method to cope with the changing delay and could in principle benefit from the current invention. The same may be true for a system using antenna tuner hardware which is relying on measuring antenna mismatch and tuning the antenna impedance back. For example, it would be possible to measure the antenna impedance (or radiated antenna power) OR overall system efficiency/battery current vs antenna mismatch at room temperature. Now, changing the temperature will significantly change the delay of the system (a standard duplexer can easily tripple its delay vs temperature from 30 nsec to 90 nsec). The antenna impedance measurement will normally deliver wrong results under such conditions (as well as the accurate AMPM distortion detection will fail). When a signal delay estimator or a method for estimating a signal delay as described herein is used, the performance parameters are likely to stay almost the same vs temperature (the antenna radiated power will be stable). Not using a signal delay estimator (delay tracking loop) or a method typically leads to significantly changes of radiated antenna power.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A signal delay estimator, comprising:
an adjustable delay element for delaying a first signal to obtain a delayed first signal;
a delay amount estimator configured to estimate a delay amount between the delayed first signal and a second signal that is similar and delayed relative to the first signal;
a leading signal determiner configured to determine whether the delayed first signal leads the second signal or vice versa, and generate a corresponding indication signal based thereon; and
a feedback element to the adjustable delay element configured to control a delay of the adjustable delay element based on the delay amount and the indication signal.

2. The signal delay estimator according to claim 1, wherein the leading signal determiner comprises:
a first input configured to receive an error signal corresponding to a delay between the delayed first signal and the second signal;
a second input configured to receive the second signal;
a slope detector configured to detect whether one of the first signal and the second signal has a slope greater than zero, and output, as a slope detector output signal, the error signal if the slope is greater than zero and otherwise output a zero signal;
an error integrator configured to integrate the slope detector output signal; and
an integration result evaluator configured to set the corresponding indication signal, indicating if an integration result is positive or negative.

3. The signal delay estimator according to claim 2, wherein the error integrator is configured to integrate the slope detector output signal over a time interval.

4. The signal delay estimator according to claim 3, wherein the time interval is variable, and wherein the signal delay estimator further comprises a time interval adjuster configured to set a relatively short time interval if a bandwidth of the first signal is greater than a threshold and a relatively long time interval if the bandwidth of the first signal is less than the threshold.

5. The signal delay estimator according to claim 2, wherein at least one of the error signal and the slope detector output signal is a time discrete signal, and wherein the error integrator is configured to sum the slope detector output signal over a plurality of samples.

6. The signal delay estimator according to claim 1, wherein the leading signal determiner comprises:
a first input configured to receive an error signal corresponding to a delay between the delayed first signal and the second signal;
a second input configured to receive the second signal;
a slope detector configured to detect whether one of the first signal and the second signal has a slope less than zero, and output, as a slope detector output signal, the error signal if the slope is less than zero and otherwise output a zero signal;
an error integrator configured to integrate the slope detector output signal; and
an integration result evaluator configured to set the corresponding indication signal, indicating if an integration result is positive or negative.

7. The signal delay estimator according to claim 1, wherein the delay amount estimator comprises:
an error signal determiner configured to determine an error signal corresponding to a delay between the delayed first signal and the second signal; and a value error integrator configured to integrate a value of the error signal over a value integration time interval, wherein the value error integrator outputs the delay amount.

8. The signal delay estimator according to claim 7, wherein the error signal determiner of the delay amount estimator comprises an output configured to provide the error signal to the leading signal determiner.

9. The signal delay estimator according to claim 1, further comprising at least one DC remover configured to remove a DC component of at least one of the first signal and the second signal.

10. The signal delay estimator according to claim 1, wherein the adjustable delay element comprises an integer delay portion and a fractional delay portion relative to a sampling rate of the first and second signals.

11. A mobile communication device, comprising:
an antenna port;
a digital baseband processor;
an analog-frontend coupled to the antenna port and to the digital baseband processor; and
a signal delay estimator associated with the digital baseband processor and the analog-frontend, comprising:
an adjustable delay element configured to delay a first signal to obtain a delayed first signal;
a delay amount estimator configured to estimate a delay amount between the delayed first signal and a second signal that is similar and delayed relative to the first signal;
a leading signal determiner configured to determine whether the delayed first signal leads the second signal or vice versa, and generate a corresponding indication signal; and
a feedback element to the adjustable delay element configured to control a delay based on the delay amount and the indication signal.

12. The mobile communication device according to claim 11, wherein the first signal is provided by the digital baseband processor and the second signal is provided by the analog-frontend to the antenna port based on the first signal.

13. A method for estimating a delay between a first signal and a similar second signal, the method comprising:
delaying the first signal by an adjustable delay to obtain a delayed first signal;
estimating a delay amount between the delayed first signal and the second signal;
determining whether the delayed first signal leads the second signal or vice versa and generating a corresponding indication signal based thereon; and
adjusting the adjustable delay used for delaying the first signal based on the estimated delay amount and the indication signal.

14. The method according to claim 13, wherein determining whether the delayed first signal leads the second signal or vice versa comprises:

detecting whether one of the delayed first signal and the second signal has a slope greater than zero;
determining an error signal between the delayed first signal and the second signal;
generating a slope detection signal if the slope is greater than zero and otherwise a zero signal;
integrating the error signal if the slope is greater than zero; and
setting the indication, depending on whether an integration result is positive or negative.

15. The method according to claim 14, wherein the error signal is integrated over a time interval and then evaluated as to whether the integration result is positive or negative.

16. The method according to claim 15, further comprising:
setting a relatively short time interval as the time interval if a bandwidth of the first signal is greater than a threshold and setting a relatively long time interval as the time interval if the bandwidth of the first signal is less than the threshold.

17. The method according to claim 14, wherein at least one of the error signal and the slope detection signal is a time discrete signal, and wherein integrating the error signal comprises summing the error signal over a plurality of samples.

18. The method according to claim 13, further comprising:
setting a loop gain based on one of a decreasing loop gain and an estimation of a noise portion within the delay amount; and
scaling the conditionally inverted delay amount with the loop gain.

19. A transmitter path, comprising:
an analog signal generator configured to receive an input transmit signal;
an amplifier coupled to an output of the analog signal generator and configured to generate an output transmit signal;
a delay tracking loop configured to estimate a delay between the input transmit signal and the output transmit signal;
an evaluation circuit configured to output an adjustment signal to adjust one or more parameters of the analog signal generator or the amplifier based on a comparison of the input transmit signal and the output transmit signal according to the estimated delay.

20. The transmitter path of claim 19, wherein the adjustment signal comprises a supply voltage adjustment signal configured to modify a supply voltage of the amplifier.

21. The transmitter path of claim 19, wherein the adjustment signal comprises a bias condition adjustment signal configured to modify a bias voltage of the amplifier.

22. The transmitter path of claim 19, wherein the analog signal generator further comprises a mixer arrangement configured to receive the input transmit signal and provide an output signal to the amplifier.

* * * * *